United States Patent
Sellnau et al.

(10) Patent No.: US 6,204,715 B1
(45) Date of Patent: Mar. 20, 2001

(54) SIGNAL AMPLIFYING CIRCUIT

(75) Inventors: Mark C. Sellnau, Bloomfield Hills; Raymond A. Tidrow, Warren, both of MI (US)

(73) Assignees: General Motors Corporation, Detroit; Delphi Technologies Inc., Troy, both of MI (US)

( * ) Notice: Subject to any disclaimer, the term of this patent is extended or adjusted under 35 U.S.C. 154(b) by 0 days.

(21) Appl. No.: 09/310,687

(22) Filed: Feb. 26, 1999

(51) Int. Cl.[7] ........................................ H03K 5/08
(52) U.S. Cl. .................... 327/309; 327/309; 327/313; 327/314; 327/374; 327/375; 361/56
(58) Field of Search ............................ 327/309, 310, 327/311, 313, 314, 315, 325–8, 108, 91, 94, 374, 375, 379

(56) References Cited

U.S. PATENT DOCUMENTS

| | | | |
|---|---|---|---|
| 3,798,559 | * 3/1974 | Tomita et al. ........................ | 327/311 |
| 3,935,479 | * 1/1976 | Andreasen et al. .................. | 327/306 |
| 4,241,266 | * 12/1980 | Orban .................................... | 327/309 |
| 4,464,635 | * 8/1984 | Rypkema ............................. | 330/284 |
| 4,620,438 | 11/1986 | Howng .................................. | 73/35 |
| 4,668,875 | * 5/1987 | Miyazaki et al. ................... | 327/311 |
| 4,724,702 | 2/1988 | Hamren ................................ | 73/115 |
| 5,062,294 | 11/1991 | Iwata .................................... | 73/115 |
| 5,264,736 | * 11/1993 | Jacobson ............................. | 327/365 |
| 5,371,472 | 12/1994 | Wohlstreicher ..................... | 330/107 |

OTHER PUBLICATIONS

Lally, "Application of Integrated Circuits to Piezoelectric Transducers," Instrument Society of America, 22nd Annual ISA Conference, Preprint P4–2–PHYMMID–67, 1967.

MacArthur et al, "Use of Field Effect Transistors in Shock Tunnel Instrumentation Circuits," Cornell Aeronautical Laboratory, Inc., Paper presented at the 2nd International Congress on Instrumentation in Aerospace Simulation Facilities at Stanford University, Aug. 1966.

Mahr, "Measuring and Processing Charge Signals from Piezoelectric Transducers," Kistler Instrumente AG, translation from *Technisches Messen*, vol. 49, No. 4, pp. 149–158 (1982).

* cited by examiner

Primary Examiner—Timothy P. Callahan
Assistant Examiner—An T. Luu
(74) Attorney, Agent, or Firm—George A. Grove

(57) ABSTRACT

Circuitry for amplifying a single-ended analog sensor output includes a field effect transistor (FET) having a gate connected to a first end of a capacitor, the second opposite end of which is connectable to the sensor output. The gate of the FET is also connected to a first end of a resistor and to a cathode of a diode. The anode of the diode, the opposite end of the resistor and the drain of the FET are connectable to a ground reference, and the source of the FET defines an amplifier output that is connectable to a constant current source. The capacitor, resistor and diode are operable to bias the FET to thereby prevent clipping of the output signal at the amplifier output. A high-pass filter is also provided at the second end of the capacitor, and a number of diodes are preferably included for providing for amplifier input protection, electrostatic discharge protection and output DC overvoltage protection. When the amplifying circuit of the present invention is implemented integral with a single-ended, case grounded sensor configuration, only one wire per sensor is required.

20 Claims, 3 Drawing Sheets

SIGNAL AMPLIFYING CIRCUIT

TECHNICAL FIELD

The present invention relates generally to signal amplifying circuitry and more specifically to such circuitry for amplifying signals provided by piezoelectric sensors.

BACKGROUND OF THE INVENTION

Electronic amplifiers for amplifying signals generated by analog sensors and/or transducers are known and have been extensively used in the automotive industry for decades. One particular class of transducers with which such amplifiers are often implemented are known as piezoelectric sensors, examples of which include pressure sensors, accelerometers and the like. Piezoelectric sensors are "self-generating" transducers in that they do not require externally supplied electrical power to generate output signals under dynamic mechanical loading conditions.

When dynamically loaded, piezoelectric sensors produce a high-impedance differential charge signal. In some applications, the ground-isolated differential output signal is amplified via a two-input signal amplifier, and in other applications one end of the differential charge signal is grounded (typically to the sensor housing) and a single-ended output is amplified via a single-input amplifier. In either case, electronic amplifiers for use with such piezoelectric sensors are operable to convert the high-impedance charge signal to a low-impedance voltage usable by signal processing circuitry such as a so-called engine control module (ECM), powertrain control module (PCM) or the like.

Generally, four basic amplifier configurations are used in the automotive and related industries for amplifying piezoelectric sensor signals:

a voltage amplifier using an operational amplifier, a charge amplifier using an operational amplifier, a current integrator using a number of operational amplifiers, and a unity-gain source follower amplifier using a field effect transistor. While each of the foregoing amplifier configurations are generally capable of appropriately conditioning the sensor output signals under some operating conditions, known embodiments of these amplifier configurations have certain drawbacks associated therewith and are accordingly incapable of satisfying demanding underhood requirements while maintaining desired operational characteristics as well as acceptable manufacturing goals (i.e., cost and ease of fabrication).

For example, one prior art sensor amplifying circuit 10 of the voltage amplifier type is illustrated in FIG. 1. Circuit 10 includes a piezoelectric sensor 12 having a single-ended input connected to an input VIN of a signal amplifier circuit 14. VIN is connected to a non-inverting input of a known operational amplifier 16, to one end of a capacitor C and to one end of a resistor R2, the opposite ends of which are connected to a REF output of circuit 14. The REF output is typically connected to ground potential in operation. The inverting input of amplifier 16 is connected to one end of another resistor R1 and to one end of a feedback resistor RF. The opposite end of R1 is connected to REF, and the opposite end of RF is connected to an output of amplifier 16 which provides the amplified sensor signal VOUT. Amplifier 16 requires connections to REF and to a power supply VCC for operation. While amplifier circuit 14 provides for satisfactory signal conditioning operation, operational amplifiers rated for underhood applications (i.e., −40° C. to +150° C.) are generally cost prohibitive.

An example of another prior art sensor amplifying circuit 20 of the charge amplifier type is illustrated in FIG. 2. Circuit 20 includes a piezoelectric sensor 12 having a sensor output connected to an input VIN of a signal amplifying circuit 22. VIN is connected to one end of a resistor R1, the opposite end of which is connected to an inverting input of an operational amplifier 24. The inverting input of amplifier 24 is also connected to one end of a feedback resistor RF and to one end of a capacitor C, the opposite ends of which are connected to an output of amplifier 24 which provides the amplified sensor signal VOUT. The non-inverting input of amplifier 24 is connected to one end of a resistor RA and to one end of another resistor RB. The opposite end of RA is connected to a power supply input VCC and the opposite end of RB is connected to a REF input which is typically connected to ground potential. The operational amplifier 24 must also be connected to VCC and REF for operation thereof.

Charge amplifiers of the type illustrated in FIG. 2 are widely used for amplifying signals produced by piezoelectric sensors and are commonly used in instrumentation applications employing pressure, force and/or acceleration sensors. The output voltage VOUT of amplifier circuit 22 is negatively proportional to the input charge and is determined solely by the feedback capacitor C. With the non-inverting input set at a DC reference voltage VREF, and the inverting input comprising a virtual ground node, the operational amplifier 24 drives the output in such a manner that the input voltages are equal. RF and C comprise a high-pass filter and determine the low frequency characteristics of the amplifier.

The amplifier circuit 22 has several practical drawbacks associated therewith. For example, as with amplifier circuit 14 of FIG. 1, an operational amplifier 24 rated for underhood applications is typically cost prohibitive. Moreover, circuit 22 has a long power-up delay (up to 10 seconds) due to the large component values often required for RF and C. The circuit configuration illustrated in FIG. 2 can be enhanced to address the foregoing deficiencies but doing so undesirably adds further cost to sensor circuit 20.

An example of another prior art sensor amplifying circuit 30 of the current integrator type is illustrated in FIG. 3. Circuit 30 includes a piezoelectric sensor 12 having a sensor output connected to an input VIN of a signal amplifying circuit 32. VIN is connected to an inverting input of a first operational amplifier circuit 34 and to one end of a first feedback resistor RF1. The opposite end of RF1 is connected to an output V1 of amplifier 34 and to one end of a capacitor C1. The opposite end of C1 is connected to one end of a resistor R1, the opposite end of which is connected to an inverting input of a second operational amplifier 36, one end of a second feedback resistor RF2 and one end of a capacitor C2. The opposite ends of RF2 and C2 are connected to an output of amplifier 36 which provides the amplified sensor signal VOUT. The non-inverting inputs of amplifiers 34 and 36 are connected to a REF input which is typically connected to ground potential. As with the amplifier circuits of FIGS. 1 and 2, amplifiers 34 and 36 include connections to an external power supply VCC and to REF.

Amplifier 34 comprises a current to voltage converter which provides an output proportional to the change in sensor output. C1 blocks the DC component of V1 and amplifier 36 comprises a conventional voltage integrator and integrates the AC component of V1 to produce a signal proportional to the mechanical force acting on sensor 12. As with the amplifier circuits of FIGS. 1 and 2, the cost of operational amplifiers 34 and 36, if rated for underhood applications, is cost prohibitive. Moreover, the size and cost of capacitor C1 is excessive and accordingly impractical for use integral with the sensor 12.

An example of another prior art sensor amplifying circuit 40 of the unity-gain source follower FET type is illustrated in FIG. 4. Circuit 40 includes a piezoelectric sensor 12 having a sensor output connected to an input VIN of a signal amplifying circuit 42. VIN is connected to a gate of a p-channel enhancement mode metal oxide semiconductor field effect transistor (MOSFET) M1, to one end of a resistor R3 and to one end of a capacitor CR. The opposite end of R3 is connected to one end of a resistor R1 and to one end of a resistor R2. The opposite end of R1 is connected to the source of M1 and the opposite end of R2 is connected to a reference input REF that is typically connected to ground potential. The drain of M1 is connected to one end of a drain resistor RD, and the opposite end of RD, as well as the opposite end of CR, is connected to REF. The drain of M1 is also connected to the base of a NPN bipolar transistor Q1 having a collector connected to the source of M1 and an emitter connected to REF. A current source 44 receives electrical power from an external source VCC and has an output supplying a source current $I_S$ to the source of M1. The common connection of current source $I_S$, source of M1, resistor R1 and collector of Q1 defines the output of amplifier circuit 42 which provides the amplified sensor signal VOUT.

The configuration of MOSFET M1 in amplifier circuit 42 is well suited for amplifying high-impedance signals from piezoelectric sensors since its input impedance is high, its output impedance very low and the amplifier gain is near unity. The drain resistor RD and NPN transistor Q1 are used to bias M1 for improved linearity and dynamic range. The feedback path established by resistors R1, R2 and R3 is used to properly bias the gate of M1 and to properly bias the output of the amplifier circuit 42.

While some of the characteristics of the amplifier circuit 42 illustrated in FIG. 4 are attractive for use integral with a piezoelectric sensor (i.e., small size, avoidance of operational amplifiers, etc.), circuit 42 has several drawbacks associated therewith. For example, most circuits of this type require a supply voltage (VCC) in the range of 18–30 volts which is typically not readily available in automotive environments. In addition, biasing of the output VOUT limits the dynamic range of the circuit. Moreover, the output signal VOUT is AC coupled, whereas a DC coupled output signal is preferred for diagnostic purposes. Further, most circuits of this type require excessive current consumption (e.g., >20 mA). Further still, the circuit 42 exhibits slow power-up due to the feedback network used for biasing of the gate of M1.

What is therefore needed is a signal amplifying circuit suitable for use with a piezoelectric sensor that is robust enough to withstand harsh underhood environments while also satisfying the goals of maximizing amplifier performance and minimizing size and amplifier cost. Such an amplifier circuit is preferably packaged integral with the sensor itself while also overcoming the shortcomings associated with the various prior art amplifier circuits just described.

SUMMARY OF THE INVENTION

The foregoing shortcomings of the prior art are addressed by the present invention. In accordance with one aspect of the present invention, a signal amplifying circuit comprises a first capacitor having a first end adapted for connection to a signal source and a second opposite end, a field effect transistor (FET) having a gate connected to the second end of the first capacitor, a drain or a source adapted for connection to a reference potential and the remaining source or drain defining a circuit output, a first diode having a cathode connected to the gate and an anode connected to the drain or source adapted for connection to a reference potential, and a first resistor having a first end connected to the cathode and an opposite second end connected to the anode of the first diode, the first capacitor, first diode and first resistor biasing the gate of the FET to thereby prevent clipping of an output signal provided by the FET at the circuit output.

In accordance with another aspect of the present invention, a signal amplifying system comprises a sensor responsive to excitation thereof to produce a sensor signal at a sensor output thereof, a signal amplifier having a first field effect transistor (FET) defining a gate coupled to the sensor output, a drain or source connected to a reference potential and the remaining source or drain defining an amplifier output, a current source connected to the amplifier output and supplying a constant current thereto, and means for biasing the first FET to thereby prevent clipping of an output signal provided at the amplifier output.

One object of the present invention is to provide an improved signal amplifier circuit for conditioning a signal provided by an analog sensor.

Another object of the present invention is to provide such an improved signal amplifier circuit for conditioning a signal provided by a piezoelectric sensor such as a pressure sensor.

These and other objects of the present invention will become more apparent from the following description of the preferred embodiment.

DESCRIPTION OF THE PREFERRED EMBODIMENT

Figure 1:
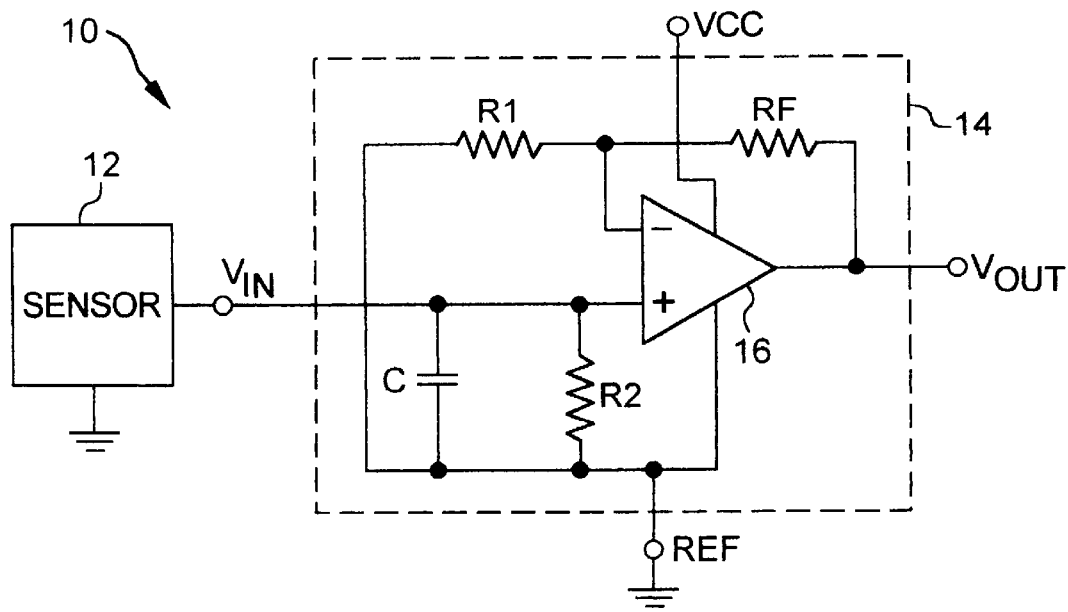
FIG. 1 is a schematic of a prior art voltage amplifier circuit for conditioning a single-ended piezoelectric sensor signal.
Figure 2:
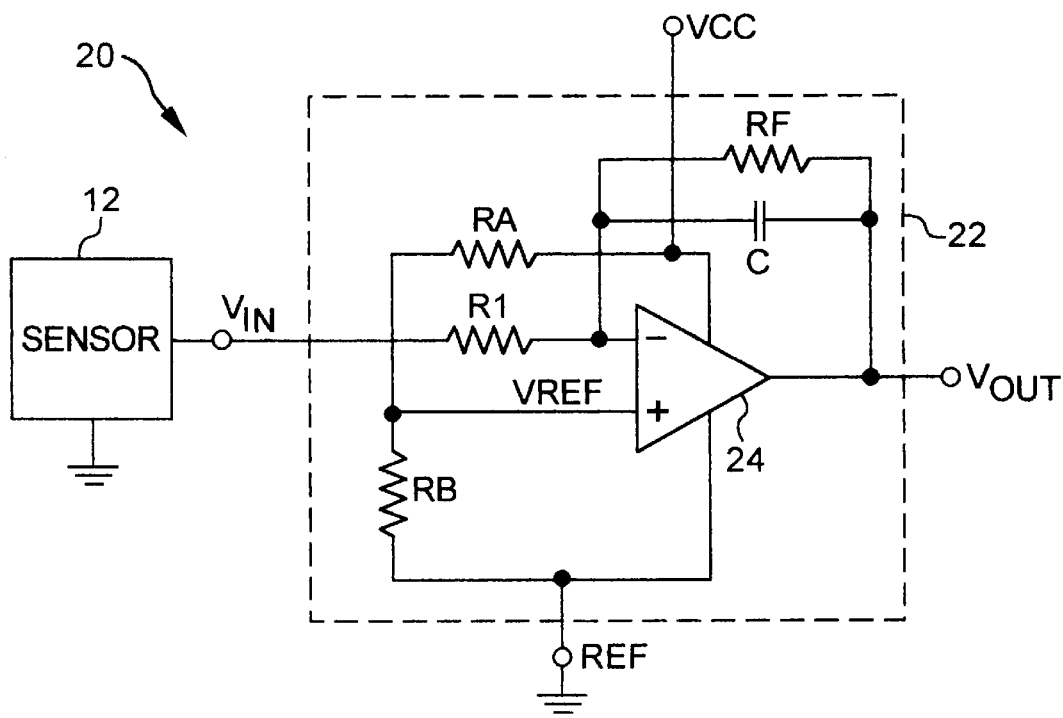
FIG. 2 is a schematic of a prior art charge amplifier circuit for conditioning a single-ended piezoelectric sensor signal.
Figure 3:
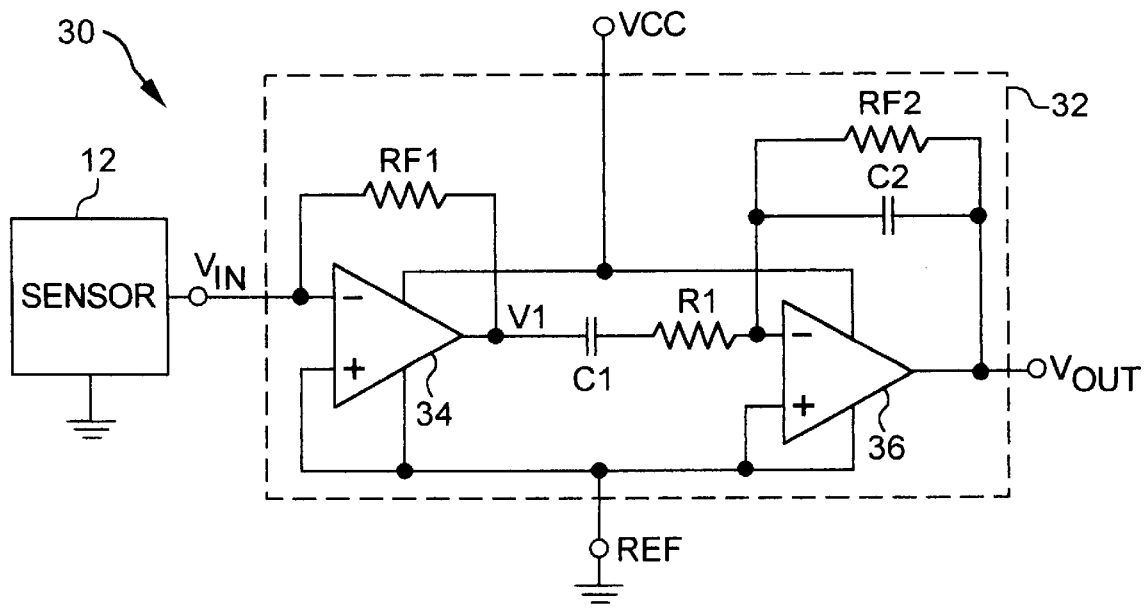
FIG. 3 is a schematic of a prior art current integrator amplifier circuit for conditioning a single-ended piezoelectric sensor signal.
Figure 4:
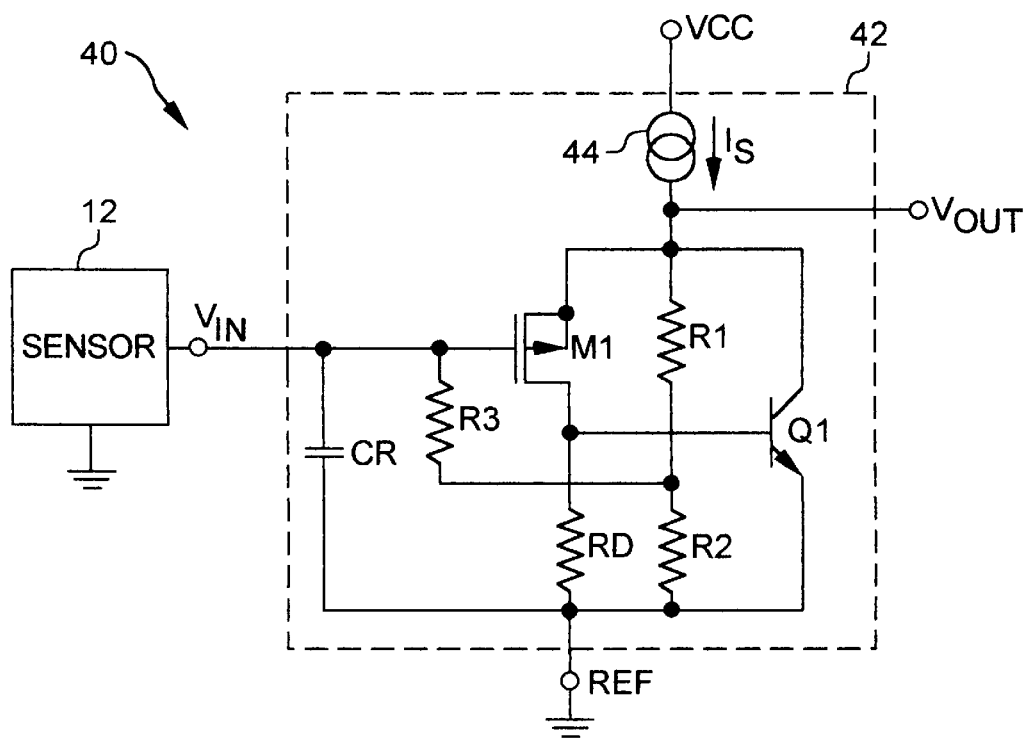
FIG. 4 is a schematic of a prior art unity-gain, source follower field effect transistor amplifier circuit for conditioning a single-ended piezoelectric sensor signal.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated devices, and such further application of the principles of the invention as illustrated therein being contemplated as would normally occur to one skilled in the art to which the invention relates.

Figure 5:
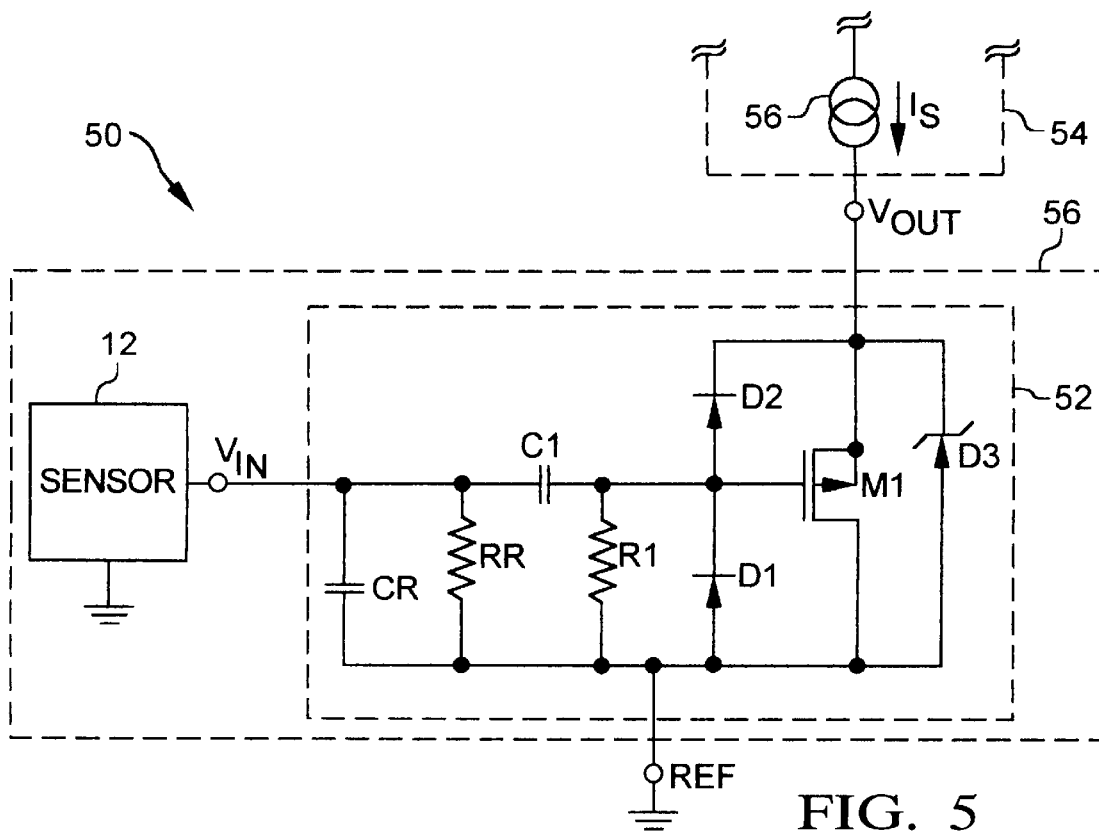
FIG. 5 is a schematic of an improved source follower field effect transistor amplifier circuit, in accordance with the present invention, for conditioning a single-ended analog sensor signal.

Referring now to FIG. 5, one embodiment 50 of a signal amplifying circuit for conditioning a single-ended analog sensor signal, in accordance with the present invention, is shown. Circuit 50 includes an analog sensor 12 having a single-ended output connected to a signal input, VIN, of signal amplifier circuit 52. Sensor 12 is a high impedance analog sensor and is preferably a piezoelectric sensor of known construction. In one embodiment, sensor 12 is a pressure sensor operable to sense pressure within a cylinder of an internal combustion engine. Those skilled in the art will, however, recognize that sensor 12 may alternatively be any known piezoelectric sensor.

The signal input VIN of amplifier circuit 52 is connected to one end of a capacitor CR, one end of a resistor RR and to one end of a capacitor C1. The opposite ends of CR and RR are connected to a reference terminal REF of circuit 52. Preferably, REF is set to ground potential in the typical operation of circuit 50, although the present invention contemplates that the REF terminal may alternatively be set to some other potential. The opposite end of C1 is connected to one end of a resistor R1, the cathode of a first diode D1, the anode of a second diode D2 and to the gate of a field effect transistor M1. The anode of D1 and the opposite end of R1 are connected to the REF terminal and the cathode of D2 is connected to a signal output VOUT of circuit 52.

In one embodiment, field effect transistor M1 is a p-channel transistor having a drain connected to the REF terminal and source connected to signal output VOUT. In one specific embodiment, transistor M1 is a metal oxide semiconductor field effect transistor (MOSFET) configured as a p-channel enhancement mode MOSFET. An example of such a transistor particularly well suited for use with the present invention is a lateral MOSFET part number LP08 developed by Supertex, Inc. The LP08 is manufactured in accordance with a lateral MOS process that provides excellent control of gate oxide thickness and yields a MOSFET having a gate-to-source threshold voltage, $V_{gs,th}$, that is lower than most double-diffused MOS (DMOS) devices with vertical structure. The LP08 has a maximum $V_{gs,th}$ of −1.0 volts with a typical $V_{gs,th}$ of −0.7 volts. The LP08 is preferably implemented in the present invention in a standard SOT-23 package.

In some applications of the present invention, transistor M1 may alternatively be a n-channel field effect transistor, such as a n-channel MOSFET, whereby the source of M1 is connected to the REF terminal and the drain of M1 is connected to VOUT. In either case, the signal dynamic range of amplifying circuit 50 is equal to a reference voltage (typically 5 or 10 volts) minus $V_{gs,th}$ and the connection system voltage drop. The dynamic range may accordingly be maximized by selecting a MOSFET having a very low $V_{gs,th}$ which may be further reduced by operating the selected MOSFET at a low drain current ($I_d$).

In any case, amplifier circuit 52 further includes a diode D3 having an anode connected to the REF terminal and cathode connected to the signal output VOUT. Although sensor 12 and amplifier circuit 52 are typically manufactured as separate components, such components are preferably integrated into a single sensor housing represented by dashed-lined box 56 in FIG. 5. In this case, amplifier circuit 52 is preferably fabricated on a flexible substrate and integrated into the sensor housing in accordance with known techniques. Amplifying circuit 50 further includes a constant current source 56, preferably provided off board of circuit 52, such as part of a sensor interface circuit 54, to provide drain current to transistor M1.

The operation of amplifier circuit 52, as it relates to the various components thereof, will now be described in detail. An important feature of the input stage of amplifier circuit 52 is a charge attenuator formed by the internal source capacitance ($C_s$) of sensor 12 and capacitor CR of circuit 52. Charge generated by sensor 12 is divided across these two capacitances with approximately 93% [i.e., CR/(CR+$C_s$)] of the charge flowing to the capacitor CR. This type of piezoceramic loading is predominately a "charge mode" and is preferred over "voltage mode" applications. The voltage generated across the capacitor CR is defined by the equation V=q/($C_s$+CR), where q is the charge generated by the piezoceramic element of sensor 12. Since the MOSFET M1 is configured as a unity-gain source follower, CR is the sole determinant of amplifier gain. In one embodiment, CR is specified with a 2% tolerance to thereby provide a very stable and repeatable overall channel gain over the full range of operating temperature.

The combination of CR and RR form a high-pass filter that is used to stabilize the piezoelectric transducer signal in the presence of thermal-induced signals (drift). The high-pass filter cutoff frequency is positioned high enough to reject unwanted thermal error signals but low enough to pass the needed frequency content in the sensor signal waveform. In a particular embodiment of amplifying circuitry 50, wherein sensor 12 is a pressure sensor operable to sense cylinder pressure of an internal combustion engine, the frequency content of the cylinder pressure waveform is a multiple of the firing frequency. The lowest firing frequency for engine idle conditions is approximately 5 Hz. In order satisfy system requirements, the frequency must be passed through a second-order high-pass filter with less then about 1.0 degree phase shift. Capacitor CR and resistor RR comprise the first pole of a passive high-pass filter with a cutoff frequency of about 0.1 Hz. Capacitor C1 and resistor R1 comprise the second pole of this filter with a cutoff frequency of approximately 0.1 Hz. The MOSFET gate impedance is typically high enough to prevent loading of this passive filter, and it has been determined that a cutoff frequency of 0.1 Hz. is sufficient to reject most of the thermal signal content for a variety of vehicle operating conditions.

Amplifier input biasing is required to avoid signal clipping for signal-ended piezoceramic configurations operated from unipolar power supplies. Heretofore, feedback networks have been used to provide such input biasing as described hereinabove in the background section. With an amplifier circuit 52 illustrated in FIG. 5, input biasing is accomplished via diode clamp D1 referenced to ground potential. The gate voltage of MOSFET M1 will automatically bias above zero volts using the self-generating feature of the piezoelectric sensor 12. For any cycle that the gate of MOSFET M1 goes negative, charge from the piezoelectric sensor 12 will forward bias diode D1, charge capacitor C1 and accordingly bias the gate of MOSFET M1 above ground potential. The DC bias is carried across capacitor C1 which acts as a blocking capacitor and allows the sensor 12 to remain at zero bias. The gate voltage of M1 is permitted to bleed down through resistor R1 according to a time constant established by R1 and C1. Upon power-up, approximately one combustion cycle is needed for input biasing to occur. For subsequent cycles, only the lowest portion of the signal waveform is used to maintain bias, and this portion of the waveform is typically not used for engine control purposes.

The input biasing structure of amplifier circuit 52 has several advantages over prior art techniques. For example, only one additional passive component, diode D1, is needed to accomplish input biasing as compared to the complicated feedback networks used in prior arrangements. Additionally, sensor 12 always operates at exactly zero bias, avoiding possible silver migration and other electric field problems associated with piezoelectric transducers. Moreover, the self-generating feature of piezoelectric sensors provides greater current for biasing than "conventional feedback networks" and consequently provides very fast biasing and stabilization upon power-up.

During sensor installation into a cylinder head, high mechanical pre-loads may be applied to the sensor structure 56 which may result in the generation of high output signals from sensor 12. Up to 1,100 nC of charge and 90 volts may typically be applied across CR, RR, C1, R1 and the gate of MOSFET M1. Similarly, during sensor removal a negative charge and negative voltage may be created across these elements. Amplifier circuit 52 must accordingly limit these voltages and shunt excess charge to ground without component damage. To provide such protection, diodes D1, D2 and D3 provide a "diode protection loop" which limits the voltage across the gate of M1 to safe levels.

The likelihood of electrostatic discharge (ESD) damage to the gate of transistor M1 is very low once the circuit 52 is assembled and installed in an appropriate housing. For any rare or unforeseen circumstances, however, diodes D1, D2 and D3 typically provide sufficient ESD protection for any possible electrostatic discharges at the gate of M1. Positive ESD voltages will be shunted through D2 and D3 to ground. Negative ESD voltages will be shunted through D1 to ground.

Figure 6A:
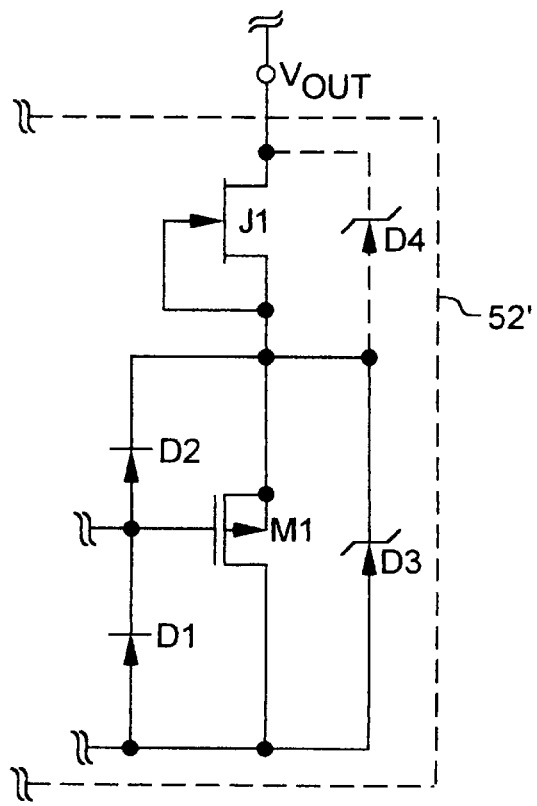
FIG. 6A is a schematic of an alternate embodiment of the output portion of the amplifier circuit of FIG. 5 illustrating one embodiment of circuitry for limiting load current.
Figure 6B:
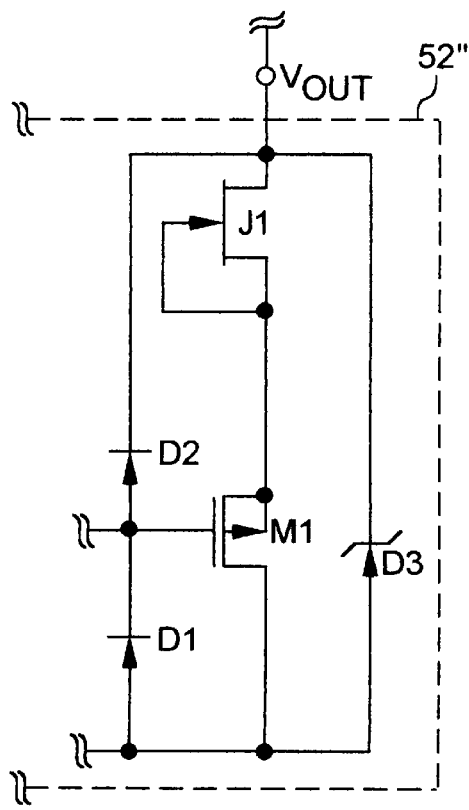
FIG. 6B is a schematic of another alternate embodiment of the output portion of the amplifier circuit of FIG. 5 illustrating another embodiment of circuitry for limiting load current.

Output DC overvoltage protection prevents damage to the amplifier circuit 52 in the event that a low output impedance DC supply (i.e., battery voltage) is continuously contacted to signal output VOUT. For this reason, amplifier circuit 52 may be optionally provided with over voltage protection circuitry. One example of a modified amplifier circuit 52' including overvoltage protection circuitry is illustrated in FIG. 6A and includes a field effect transistor J1 disposed between transistor M1 and signal output VOUT. Specifically, a drain of J1 is connected to a cathode of a diode D4 and to the signal output VOUT. The gate of J1 is connected to the source of J1 as well as to the anode of D4 and to the common connection of the cathodes of D2 and D3 and source of M1. Alternatively, as shown in FIG. 6B, another modification to amplifier circuit 52 resulting in amplifier circuit 5" includes a field effect transistor J1 disposed between signal output VOUT and transistor M1 and "inside" the protection loop of diodes D2 and D3. Specifically, amplifier circuit 52" includes a field effect transistor J1 having a drain connected to signal output VOUT and to the cathodes of D2 and D3. The gate of J1 is connected to the source of J1 and to the source of transistor M1. In either FIG. 6A or FIG. 6B, field effect transistor J1 is preferably a n-channel junction field effect transistor (JFET). It is to be understood, however, that J1 may alternatively be a n-channel MOSFET or a p-channel JFET or MOSFET appropriately connected. In one embodiment, transistor J1 limits the current to MOSFET M1 below 10mA for external voltages up to 15 volts.

Table 1 below summarizes component information for one embodiment of amplifier circuit 52 (including 52' and 52"). It is to be understand, however, that the component information summarized in Table 1 represents only one preferred embodiment, and that the present invention contemplates other specifications and component values for each of the items listed in Table 1. Those skilled in the art will recognize that the choice of component characteristics, manufacturer and component values will likely depend, at least in part, on the particular application of amplifier circuit 52, and that such components should be chosen accordingly.

TABLE 1

| Comp Label | EIA Package | SMT Device | Manufacturer Part Number | Component Values | Operating Temp. Range (C) |
|---|---|---|---|---|---|
| CR | EIA 1210 | NPO/COG Chip Capacitor | Vitramon VJ1210A123GXXAR | 12.3 nF<br>Tol. = 2%<br>50V; 400V Rating | −50 to 150 |
| RR | EIA 0805 | Chip Resistor | IMS RC3-0805-120635 | 125 MΩ<br>Tol. = +/− 35%<br>TCR +/− 150 ppm/C max<br>150V; 400V Rating | −50 to 150 |
| C1 | EIA 0805 | NPO/COG Chip Capacitor | Vitramon VJ0805A1800GXXAR | 1.80 nF<br>Tol. = 5%<br>50V; 400V Rating | −50 to 150 |
| R1 | EIA 0805 | Chip Resistor | IMS RC3-0805-820635 | 820 MΩ<br>Tol. = +/− 35%<br>TCR +/− 150 pp/C max<br>150V; 400V Rating | −50 to 150 |
| D1, D2 | SOT-23 | Low-Leakage Diode | Siliconix SSTPAD5 | $I_r$ = 5 pA max<br>$BV_R$ = −30 Vmin<br>$P_D$ = 350 mW<br>$I_F$ = 10 mA (typ) | −50 to 150 |
| Q1 | SOT-23 | P-Channel Enhancement-Mode MOSFET | Supertex LP08 | $V_{gs(th)}$ = 0.5 to 1.0V<br>$BV_{dss}$ = −16.5V<br>$R_{ds(ON)}$max = 12Ω | −50 to 150 |
| D3, D4 | SOD-123 | Zener Diode | Motorola MMSZS245B-T3 | 15V<br>$P_D$ = 500 mW<br>ESD Class 3: 16kV "HBM" | −50 to 150 |

TABLE 1-continued

| Comp Label | EIA Package | SMT Device | Manufacturer Part Number | Component Values | Operating Temp. Range (C) |
| --- | --- | --- | --- | --- | --- |
| J1 | SOT-23 | N-Channel JFET | Siliconix 55T5485 | $I_{dss}$ = 4 to 10 mA $V_{(BR)GSS}$min = −25V | −50 to 150 |
| Substrate | n/a | Novaclad Flex Circuit | Sheldahl, Inc. RX-408-881 | ½oz. copper; 2 mil polyimide | −50 to 150 |

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. A signal amplifying circuit comprising:
   a first capacitor having a first end adapted for connection to a signal source and a second opposite end;
   a field effect transistor (FET) having a gate connected to said second end of said first capacitor, one of a drain and a source adapted for connection to a reference potential and an opposite one of said drain and a source defining a circuit output; and
   a first diode having a cathode connected to said gate and an anode connected to said one of a drain and a source adapted for connection to a reference potential, said first capacitor and said first diode establishing a positive bias at said gate of said FET with respect to said reference potential when an input signal at said first end of said first capacitor is negative with respect to said reference potential to thereby prevent clipping of an output signal provided by said FET at said circuit output.

2. The signal amplifier circuit of claim 1 further including a second capacitor having a first end connected to said first end of said first capacitor and a second opposite end connected to said anode of said first diode, said second capacitor forming a charge attenuator and determining a gain of said amplifier circuit.

3. The signal amplifier circuit of claim 2 further including a second resistor having a first end connected to said first end of said first capacitor and a second opposite end connected to said anode of said first diode, said second resistor and said second capacitor forming a high pass filter.

4. The signal amplifier of claim 3 further including:
   a second diode having an anode connected to said gate of said FET and a cathode connected to said circuit output; and
   a third diode having an anode connected to said second end of said first resistor and a cathode connected to said circuit output, said first, second and third diodes providing for amplifier input and electrostatic discharge protection.

5. The signal amplifier of claim 1 wherein said FET is a metal oxide semiconductor field effect transistor (MOSFET).

6. The signal amplifier of claim 5 wherein said MOSFET is a p-channel enhancement mode MOSFET.

7. The signal amplifier of claim 1 further including a first resistor having a first end connected to said cathode and a second end connected to said anode of said first diode, said first resistor dissipating said positive bias on said gate of said FET.

8. A signal amplifying system comprising:
   a sensor responsive to excitation thereof to produce a sensor signal at a sensor output thereof;
   a signal amplifier having a first field effect transistor (FET) defining a gate coupled to said sensor output, one of a drain and a source connected to a reference potential and an opposite one of said drain and a source defining an amplifier output;
   a current source connected to said amplifier output and supplying a constant current thereto;
   a first diode connected between said gate of said first FET and said reference potential; and
   a capacitor connected between said sensor output and said gate of said first FET, said first diode and said first capacitor establishing a positive bias at said gate of said first FET with respect to said reference potential when said sensor signal is negative with respect to said reference potential to thereby prevent clipping of an output signal provided at said amplifier output.

9. The signal amplifying system of claim 8 wherein said sensor is a high impedance sensor operable to produce a single-ended output signal at said sensor output.

10. The signal amplifying system of claim 9 wherein said sensor is a piezoelectric sensor.

11. The signal amplifying system of claim 10 wherein said sensor is a pressure sensor operable to sense pressure in a cylinder of an internal combustion engine.

12. The signal amplifying system of claim 8 wherein said current source forms part of a circuit separate from said sensor and said amplifier circuit.

13. The signal amplifying system of claim 8 further including means for limiting load current through said first FET.

14. The signal amplifying system of claim 13 wherein said means for limiting load current through said first FET includes a second field effect transistor (FET) disposed between said amplifier output and said opposite one of said drain and source of said first FET, said second FET having a drain connected to said amplifier output and a gate and source each connected to said opposite one of said drain and a source of said first FET.

15. The signal amplifying system of claim 14 further including:
   a second diode having an anode connected to said gate of said first FET and a cathode connected to said source and gate of said second FET;
   a third diode having an anode connected to said reference potential and a cathode connected to said source and gate of said second FET; and
   a fourth diode having an anode connected to said source and gate of said second FET and a cathode connected to said amplifier output.

16. The signal amplifying system of claim 14 further including:
   a second diode having an anode connected to said gate of said first FET and a cathode connected to said amplifier output; and a third diode having an anode connected to said reference potential and a cathode connected to said amplifier output.

17. The signal amplifying system of claim 14 wherein said second FET is a junction field effect transistor (JFET).

18. The signal amplifying system of claim 14 further including:
    a second capacitor having a first end connected to said sensor output and a second opposite end connected to said reference potential; and
    a resistor having a first end connected to said first end of said capacitor and a second opposite end connected to said reference potential, said resistor and said capacitor forming a high pass filter.

19. The signal amplifying system of claim 18 wherein said first FET is a metal oxide semiconductor p-channel enhancement mode field effect transistor.

20. The signal amplifying system of claim 8 further including a resistor connected between said gate of said FET and said reference potential, said resistor dissipating said positive bias on said gate of said first FET.

* * * * *